United States Patent [19]

Cottrell et al.

[11] Patent Number: 4,470,191

[45] Date of Patent: Sep. 11, 1984

[54] PROCESS FOR MAKING COMPLEMENTARY TRANSISTORS BY SEQUENTIAL IMPLANTATIONS USING OXIDATION BARRIER MASKING LAYER

[75] Inventors: Peter E. Cottrell; Henry J. Geipel, Jr., both of Essex Junction; Donald M. Kenney, Shelbourne, all of Vt.

[73] Assignee: International Business Machines Corporation, Armonk, N.Y.

[21] Appl. No.: 448,125

[22] Filed: Dec. 9, 1982

[51] Int. Cl.[3] .................... H01L 7/54; H01L 21/265; B01J 17/00
[52] U.S. Cl. .................... 29/576 B; 29/571; 148/1.5; 148/187; 357/42; 357/91
[58] Field of Search ............... 29/576 B, 571; 148/1.5, 148/187; 357/42, 91

[56] References Cited

U.S. PATENT DOCUMENTS

| | | | |
|---|---|---|---|
| 3,700,507 | 10/1972 | Murray | 148/187 |
| 3,999,213 | 12/1976 | Brandt et al. | 357/42 |
| 4,002,501 | 1/1977 | Tamura | 148/1.5 |
| 4,033,797 | 7/1977 | Dill et al. | 148/187 |
| 4,045,250 | 8/1977 | Dingwall | 148/1.5 |
| 4,183,134 | 1/1980 | Oehler et al. | 148/187 |
| 4,224,733 | 9/1980 | Spadea | 29/571 |
| 4,244,752 | 1/1981 | Henderson, Sr. et al. | 148/1.5 |
| 4,306,916 | 12/1981 | Wollesen et al. | 148/1.5 |
| 4,382,827 | 5/1983 | Romano-Moran et al. | 148/1.5 |
| 4,385,947 | 5/1983 | Halfacre et al. | 148/187 |
| 4,399,605 | 8/1983 | Dash et al. | 29/571 |
| 4,412,375 | 11/1983 | Mathews | 29/571 |

*Primary Examiner*—Upendra Roy
*Attorney, Agent, or Firm*—Stephen J. Limanek

[57] ABSTRACT

A simple process is provided for making a planar CMOS structure wherein isolation regions required by bulk CMOS structures are first formed, an N channel device field region is self-aligned to an N well region in a semiconductor substrate and a refractory material is twice defined for forming P and N channels, the first definition masking P channel source and drain regions while defining the N channel and the second definition defining the P channel while using a photoresist layer to mask the N channel. In the process, a technique which uses a single mask level defines the well region and self-aligns the necessary field doping to the well region to provide closely spaced N and P channel devices.

20 Claims, 6 Drawing Figures

PROCESS FOR MAKING COMPLEMENTARY TRANSISTORS BY SEQUENTIAL IMPLANTATIONS USING OXIDATION BARRIER MASKING LAYER

1. Technical Field

This invention relates to a process for making dense integrated semiconductor structures and, more particularly, to a process for making an array of transistors in the complementary metal oxide semiconductor (CMOS) technology wherein both N and P channel transistors are formed on a common semiconductor substrate.

2. Background Art

It is well known that the CMOS technology provides certain advantages over integrated semiconductor technologies that use only N channel devices or P channel devices. Some of these advantages include speed and virtually no standby power.

Processes for providing CMOS devices are taught in, e.g., U.S. Pat. Nos. 4,002,501, filed June 16, 1975, and 4,183,134, filed Dec. 11, 1978. These patents teach processes for making complementary devices which have controlled channel lengths and low gate overlap capacitance by the use of thick insulators over their source and drain regions.

Other processes and structures known in the CMOS technology are taught in U.S. Pat. No. 4,045,250, filed Aug. 4, 1975, which discloses a process for producing a CMOS structure having a process step wherein a single oxidation step grows relatively thick isolation and source/drain passivation concurrently, and in U.S. Pat. No. 3,700,507, filed Oct. 21, 1969, which discloses a method of making CMOS structures with a reduced number of heat treatment steps.

In U.S. Pat. No. 4,244,752, filed Mar. 6, 1979, there is described a method of fabricating complementary integrated circuits which includes a technique for twice defining a gate polysilicon to form the P and N channel gates.

In commonly assigned U.S. patent application having Ser. No. 352,990, filed on Feb. 26, 1982, by S. Dash et al now U.S. Pat No. 4,399,605, there is described a method of making complementary field effect transistors in a semiconductor layer formed on an insulator having a first portion which includes an N type transistor with a channel region defined by N+ source and drain regions and having a second portion including a P type transistor with a channel region defined by P+ source and drain regions. An insulating layer is disposed over the first and second portions with thin insulating films formed only over the channel regions. The method includes applying a photoresist layer over the insulating layer with an opening over one of the thin insulating films, introducing a first impurity into the channel region of the one portion to adjust the impurity therein and depositing a first conductive material on the thin insulating film located over the channel region of the one portion. The photoresist layer is then removed and a second impurity is introduced into the channel region of the other portion to adjust the impurity therein. A second conductive material is deposited on the thin insulating film located over the channel region of the other portion and in contact with the first conductive material, with the second conductive material having a different work function than that of the first conductive material. The first conductive material is, preferably, platinum silicide while the second conductive material may be aluminum.

In another commonly assigned U.S. patent application having Ser. No. 446,793, entitled, "Method of Making High Density Complementary Transistors", filed by H. J. Geipel, Jr., R. R. Troutman and J. M. Wursthorn on Dec. 3, 1982, there is described a method of making complementary field effect transistors in an N type conductivity semiconductor layer which includes forming a well having a P type conductivity in the semiconductor layer and forming first and second N type conductivity regions defining a channel region within the well. A P type conductivity region is then formed within the well surrounding the first and second N type conductivity regions and the channel region, followed by the formation of a P channel device in the semiconductor layer outside of the P type well.

DISCLOSURE OF THE INVENTION

It is an object of this invention to provide a simple process for making a very planar CMOS structure with tight geometries which has well and field regions self-aligned to each other after the active device regions have been defined.

In accordance with the teachings of this invention, a simple process is provided for making a planar CMOS structure wherein isolation regions required by bulk CMOS structures are first formed, an N channel device field region is self-aligned to an N well region in a semiconductor substrate and a polysilicon layer, or other refractory material, is twice defined for forming P and N channels, the first definition masking P channel source and drain regions while defining the N channel and the second definition defining the P channel while using a photoresist layer to mask the N channel. In the process a single mask level defines the well region and self-aligns the necessary field doping to the well region to provide closely spaced N and P channel devices.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
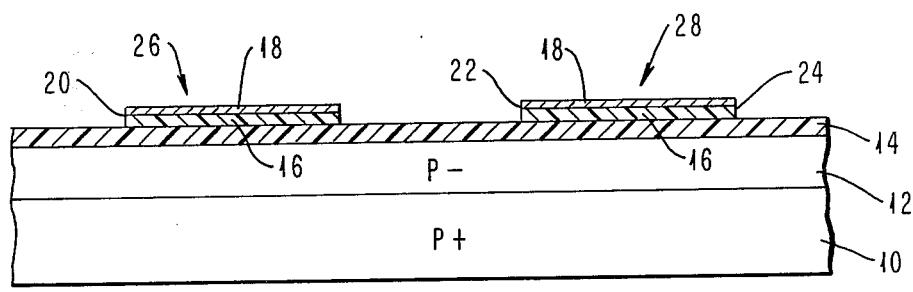
FIGS. 1-6 are sectional views of the CMOS structure made after successive steps during the process of the present invention.

Referring to the drawings in more detail, there is illustrated in FIG. 1 a sectional view of the CMOS structure made in accordance with the process of the present invention during an early stage of the fabrication thereof. The structure includes a semiconductor substrate 10, which is made of a P+conductivity type silicon and an epitaxial semiconductor layer 12, preferably P− type silicon, grown on substrate 10. A thin layer of silicon dioxide 14 is grown on the epitaxial layer 12 and a layer of silicon nitride 16 is deposited, preferably by known low pressure chemical vapor deposition techniques, on the silicon dioxide layer 14. A first layer 18 of polysilicon, which may have a thickness of 150 nanometers, is deposited on the silicon nitride layer 16 by any known technique, preferably, by undoped low pressure chemical vapor deposition. The thickness of the epitaxial silicon layer 12 may be from 1 to 15 micrometers and have a resistivity range from 5 to 50 ohm-centimeters, and the layers 14 and 16 may have a thickness of 40 and 100 nanometers, respectively.

Figure 3:
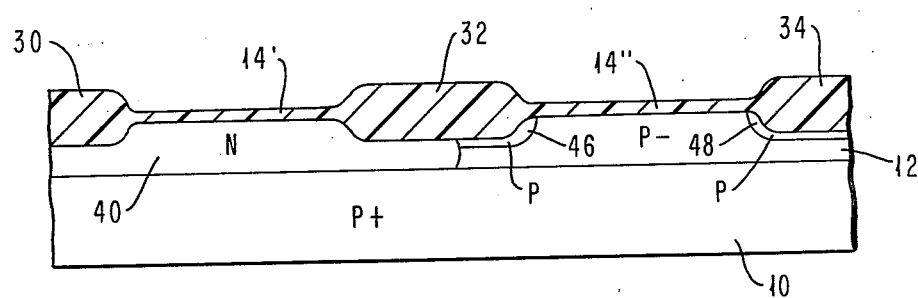

With a first conventional photoresist mask, not shown, openings 20, 22 and 24 are formed in the polysilicon and silicon nitride layers 16 and 18 to define pads 26 and 28 for semi-recessed oxide segments 30, 32 and 34, illustrated in FIG. 3 of the drawings. The first polysilicon layer 18 and the silicon nitride layer 16 may be dry etched by the use of carbon tetrafluoride ($CF_4$) and oxygen gas. The photoresist mask is then stripped in an oxygen plasma and the surface of the remaining structure cleaned by any known process.

Figure 2:
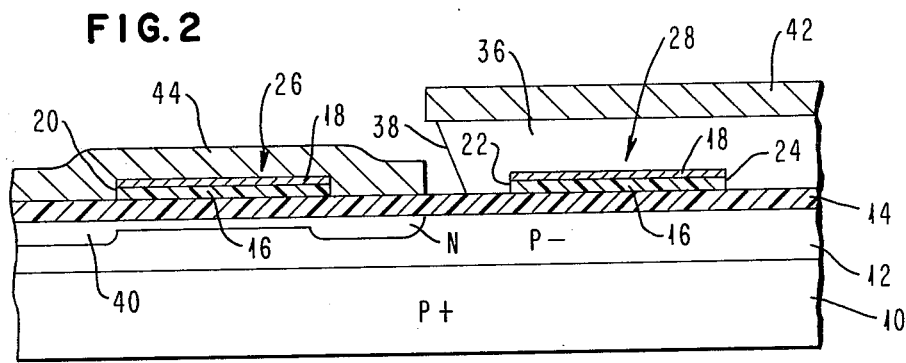

A second photoresist mask 36, illustrated in FIG. 2, is provided over the first polysilicon layer 18 and the exposed surfaces of the silicon dioxide layer 14 having an opening 38 to define an N well 40, wherein phosphorous ions are implanted. The edge of the mask 36, as indicated at opening 38, has a reentrant slope. A second layer of polysilicon is, preferably, directionally evaporated over the second photoresist mask 36 and into the opening 38 forming first and second polysilicon segments 42 and 44, respectively. This polysilicon layer may be semi-crystalline or amorphous at this point in the process. The segment 42 of the second polysilicon layer deposited over the second photoresist mask 36 is removed, along with the second photoresist mask 36, by known lift-off techniques, and the phosphorous ions are driven deeper into epitaxial layer 12 by a known heat process in an inert atmosphere.

With the segment 44 of the polysilicon layer in place, boron is implanted into selected portions of the surface of the P− epitaxial layer 12 defined by the pad 28 and polysilicon segment 44 for providing N channel device field regions 46 and 48, indicated in FIG. 3. All remaining polysilicon is now stripped and the semi-recessed oxide regions 30, 32 and 34 are grown adjacent to thin silicon dioxide regions 14' and 14" which have been protected by the silicon nitride layer 16 in pads 26 and 28. The pads 26 and 28 are then stripped, gate insulators, such as 14' and 14", are regrown and a boron channel implant is performed.

Figure 4:
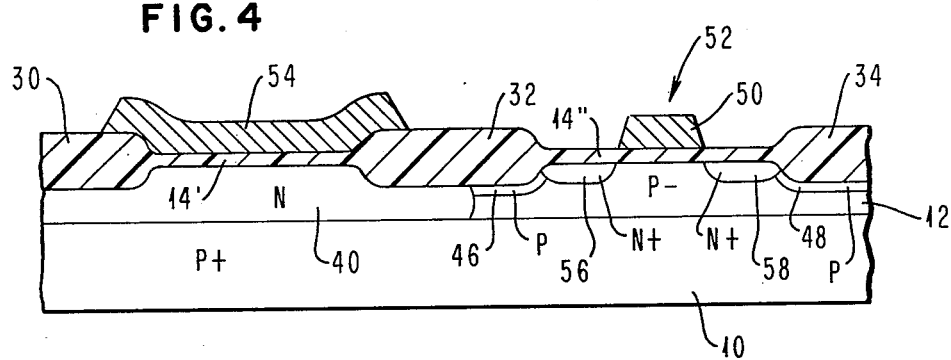

As indicated in FIG. 4 of the drawings, a third layer of polysilicon is deposited over the thin silicon dioxide regions 14' and 14" and the recessed oxide regions 30, 32 and 34 and appropriately selectively etched with the use of a third photoresist mask, not shown, to form a first segment for use as a first gate electrode 50 of a first device 52 and a second segment 54 for use as an ion mask to protect the N well 40. Arsenic ions are implanted to form N+ source and drain regions 56 and 58 for the first device 52, followed by a heating step to partially drive in the arsenic ions.

Figure 5:
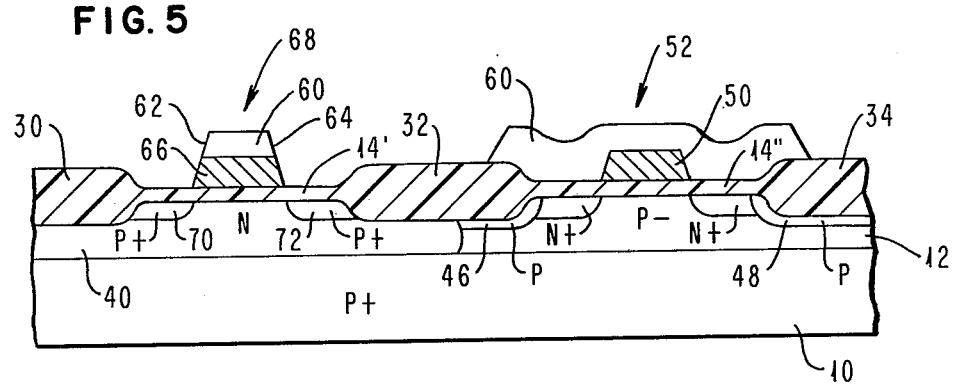
Figure 6:
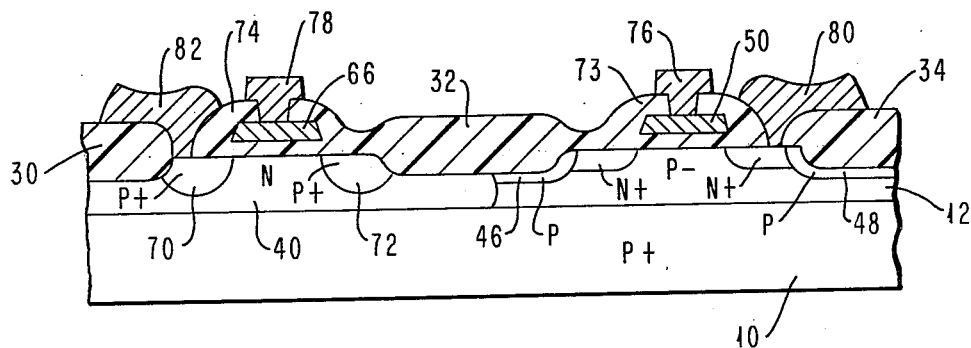

A fourth photoresist mask 60 has openings 62 and 64 for defining in second polysilicon segment 54 a second gate electrode 66 of a second device 68. The exposed polysilicon in segment 54 is etched away from the electrode 66 shown in FIG. 5. Mask 60 is also arranged as an ion barrier to protect device 52 when boron is implanted to form P+ source and drain regions 70 and 72 of the second device 68. After the boron has been implanted, the mask 60 is stripped and the remaining polysilicon, i.e., first and second gate electrodes 50 and 66 have their surfaces oxidized to form silicon dioxide layers 73 and 74, respectively, as illustrated in FIG. 6 of the drawings, with the implanted ions being further driven into the epitaxial layer 12.

Any appropriate passifying layer, such as phosphosilicate glass, may now be provided over the surface of the structure and appropriate contact holes defined and opened with the use of a fifth photoresist mask, not shown. A metal layer, e.g., copper-doped aluminum, is deposited over the passifying layer and into the openings and etched so as to form contacts such as gate electrode contacts 76 and 78 for gate electrodes 50 and 66, respectively, and source/drain region contacts such as 80 and 82.

Although the process has been described in the above embodiment in which an N well is formed in a P-epitaxial layer, it should be understood that the process may be modified within the scope of this invention by, e.g., forming a P well in an N type epitaxial layer. Also, other known barrier materials, insulating materials or dopants than those mentioned hereinabove may be used to practice this invention, as is known to those skilled in the art.

It can be seen that a simple process has been provided for making an integrated circuit CMOS structure with tight geometries which uses a lift-off technique to form a self-aligned P type field region for an N channel device and an N type P channel device well region. A refractory material such as polysilicon permits the N well to be driven in with the reversed N well mask in place. The field oxide is defined with a conventional oxidizing barrier material, while the polysilicon gate electrode layer is used as a mask and is twice defined to form the gate electrodes for the N channel and P channel transistors 52 and 68. The first definition leaves the N channel gate electrode and the P channel gate electrode and diffusion regions covered or protected by the polysilicon layer, and the second definition leaves polysilicon over only the P channel and N channel gate electrodes of transistors 52 and 68, with a photoresist mask covering the diffusion regions of transistor 52.

It should be noted further that the threshold of the P channel transistor is generally too negative in this structure in view of the work function of N+ polysilicon used to form the gate electrode 66. By using an N channel boron channel implant the threshold is increased toward zero volts. Accordingly, it can be seen that a wiring advantage is provided since the N channel and P channel gate electrodes of CMOS devices are formed from the same polysilicon material. Of course, the threshold may be further controlled by the use of multiple implants when forming the N well. Implants of different energies allow independent control of the well depth and surface doping. A deep well with a relatively low surface doping also serves to move the P channel threshold toward zero and aids in latch-up prevention by the use of the retrograde well. By adjusting the P channel threshold simultaneously with the N channel by a boron channel implant, the P channel threshold is lowered while the N channel threshold is raised to provide near optimum threshold values in a CMOS structure.

While the invention has been particularly shown and described with reference to preferred embodiments thereof, it will be understood by those skilled in the art that various changes in form and details may be made therein without departing from the spirit and scope of the invention.

What is claimed is:

1. A method of making a complementary metal oxide semiconductor (CMOS) structure comprising the steps of:

forming an oxidation barrier layer on a semiconductor substrate of a given conductivity type, defining an isolation region having first and second ends in said substrate, removing a portion of said oxidation barrier layer over said isolation region, defining with a first ion implant masking layer having a reentrant slope a well in said substrate extending from within the first end of said isolation region, implanting a first impurity having a conductivity type opposite to that of said given conductivity type into said well, masking said well with a second ion implant masking layer, removing said first masking layer, implanting a second impurity having said given conductivity type into said substrate without said well to the second end of said isolation region, removing said second masking layer, and oxidizing the surface of said substrate without the remaining portion of said oxidation barrier layer.

2. A method a set forth in claim 1 wherein an edge of said well is disposed between and at a substantial distance from the first and second ends of said isolation region.

3. A method as set forth in claim 2 wherein said second impurity is implanted into said substrate between the edge of said well and the second end of said isolation region to form a field region.

4. A method as set forth in claim 3 wherein said field region butts said N well.

5. A method as set forth in claim 3 wherein said oxidation barrier layer is a refractory material.

6. A method as set forth in claim 5 wherein said oxidation barrier layer includes silicon nitride.

7. A method as set forth in claim 3 wherein said second ion implant masking layer is a refractory material.

8. A method as set forth in claim 7 wherein said refractory material is silicon.

9. A method as set forth in claim 8 wherein said first ion implant masking layer is a photoresist layer.

10. A method as set forth in claim 9 wherein first impurity includes phosphorous, said second impurity includes boron and said substrate is made of P type conductivity silicon.

11. A method as set forth in claim 5 further including the step of forming a layer of polysilicon over said refractory material.

12. A method as set forth in claim 1 wherein said substrate is annealed after said first impurity is implanted and before said second impurity is implanted.

13. A method as set forth in claim 1 further including the step of annealing said substrate after said first and second impurities are implanted.

14. A method of making a complementary metal oxide semiconductor (CMOS) structure comprising the steps of:

forming an oxidation barrier layer on a semiconductor substrate of a given conductivity type, forming a first layer of silicon over said oxidation barrier layer, defining an isolation region having first and second ends in said substrate, removing a portion of said oxidation barrier layer and a corresponding portion of said silicon layer over said isolation region, defining with a photoresist layer having an edge with a reentrant slope a well in said substrate in an overlapping relationship with said isolation region, implanting a first impurity having a conductivity type opposite to that of said given conductivity type into said well, masking said well with a second layer of silicon, removing said photoresist layer, implanting a second impurity having said given conductivity type into said substrate without said well to an end of said isolation region, removing said silicon layers, and oxidizing the surface of said substrate without the remaining portion of said oxidation barrier layer.

15. A method as set forth in claim 14 wherein said second silicon layer is deposited over said well and over said photoresist layer and then the portion of said second silicon layer disposed over said photoresist layer is removed with said photoresist layer.

16. A method as set forth in claim 15 wherein said substrate is annealed after said first impurity is implanted and before said second impurity is implanted.

17. A process for making a semiconductor structure comprising the steps of:

growing a layer of silicon dioxide on an epitaxial semiconductor layer having a given P type conductivity, depositing a layer of silicon nitride on said silicon dioxide layer, depositing a first layer of silicon on said silicon nitride layer, forming openings in said silicon and silicon dioxide layers to define an isolation region in the surface of said epitaxial semiconductor layer, depositing a layer of photoresist over said silicon layer and in said openings, removing said photoresist layer from a point within one of said openings to a point within an adjacent opening with the edge of said photoresist layer having a reentrant slope, implanting an N type impurity into said epitaxial semiconductor layer without the remaining portion of said photoresist layer to form an N well, depositing a second layer of silicon over the remaining portion of said photoresist layer and over said N well, removing the remaining portion of said photoresist layer and the portion of said second silicon layer thereover, implanting a P type impurity into said epitaxial semiconductor layer between the end of said N well and an edge of said layer of silicon nitride to form a field region having a higher P type conductivity than said given P type conductivity, removing the remaining portions of said first and second silicon layers, and oxidizing the surface of said epitaxial layer outside of the remaining portion of said silicon nitride layer to form semi-recessed silicon dioxide segments in said epitaxial layer.

18. A method as set forth in claim 19 wherein the thickness of said second silicon layer is less than that of said photoresist layer, said N type impurity is phosphorous and said P type impurity is boron.

19. A method of making a complementary metal oxide semiconductor (CMOS) structure comprising the steps of:

forming an oxidation barrier layer on a semiconductor substrate of a given conductivity type,
defining an isolation region having first and second ends in said substrate,
removing a portion of said oxidation barrier layer over said isolation region,
defining with a first ion implant masking layer having a reentrant edge a well in said substrate extending from within the first end of said isolation region,
implanting a first impurity having a conductivity type opposite to that of said given conductivity type into said well,
masking said well with a second ion implant masking layer,
removing said first masking layer,
implanting a second impurity having said given conductivity type into said substrate without said well to the second end of said isolation region,
removing said second masking layer, and
oxidizing the surface of said substrate without the remaining portion of said oxidation barrier layer.

20. A method of making a complementary metal oxide semiconductor (CMOS) structure comprising the steps of:

forming an oxidation barrier layer on a semiconductor substrate of a given conductivity type,
defining an isolation region having first and second ends in said substrate,
removing a portion of said oxidation barrier layer over said isolation region,
defining with a first ion implant masking layer a well in said substrate extending from within the first end of said isolation region,
implanting a first impurity having a conductivity type opposite to that of said given conductivity type into said well,
depositing a second ion implant masking layer having a first portion over said well and a second portion over said first masking layer,
removing simultaneously said first masking layer and said second portion of said second masking layer,
implanting a second impurity having said given conductivity type into said substrate without said well to the second end of said isolation region,
removing the first portion of said second masking layer, and
oxidizing the surface of said substrate without the remaining portion of said oxidation barrier layer.

* * * * *